United States Patent [19]

Lutz et al.

[11] Patent Number: 5,077,083

[45] Date of Patent: Dec. 31, 1991

[54] EPOXY-SILANOL FUNCTIONAL UV CURABLE POLYMERS

[75] Inventors: Michael A. Lutz, Midland, Mich.; Allen B. Puder, Cupertino; William E. Willy, Oakhurst, both of Calif.; Leon D. Crossman, Midland, Mich.

[73] Assignee: Dow Corning Corporation, Midland, Mich.

[21] Appl. No.: 701,410

[22] Filed: May 15, 1991

Related U.S. Application Data

[62] Division of Ser. No. 445,810, Dec. 4, 1989.

[51] Int. Cl.$^5$ .................. B05D 3/06; B05D 1/40; C08F 2/46; C08J 3/28
[52] U.S. Cl. .................. 427/54.1; 427/331; 427/335; 522/31; 522/148; 522/915
[58] Field of Search .................. 522/148, 915, 31; 427/54.1, 331, 335, 401

[56] References Cited

U.S. PATENT DOCUMENTS

| | | | |
|---|---|---|---|
| 4,058,401 | 11/1977 | Crivello | 96/115 R |
| 4,101,513 | 7/1978 | Fox et al. | 526/193 |
| 4,138,255 | 2/1979 | Crivello | 96/86 P |
| 4,161,478 | 7/1979 | Crivello | 260/327 B |
| 4,256,828 | 3/1981 | Smith | 430/280 |
| 4,421,904 | 12/1983 | Eckberg et al. | 528/27 |
| 4,585,534 | 4/1986 | Pasternack et al. | 522/31 |

FOREIGN PATENT DOCUMENTS 0124057  6/1984  European Pat. Off. .

*Primary Examiner*—Marion E. McCamish
*Assistant Examiner*—Mark A. Chapman
*Attorney, Agent, or Firm*—Roger H. Borrousch

[57] ABSTRACT

Ultraviolet curable compositions useful for coating electrical devices are formed from an epoxy functional compound, a silanol functional compound, and a cationic photoinitiator. Ultraviolet radiation curable composition formed from an epoxy resin, a silanol functional compound, a carbonol functional polyether polysiloxane, and a cationic photoinitiator are useful as coatings.

2 Claims, No Drawings

EPOXY-SILANOL FUNCTIONAL UV CURABLE POLYMERS

This is a divisional of copending application Ser. No. 07/445,810 filed on 12/4/89.

BACKGROUND OF THE INVENTION

1. Field of the Invention

This invention relates to UV (ultraviolet) radiation curable compositions. More particularly, the invention relates to ultraviolet radiation curable compositions comprising epoxy functional compounds, silanol functional compounds, a photoinitiator and/or photosensitizer for an ultraviolet activated cationic cure, and preferably a carbonol functional polysiloxane.

2. Background Information

Epoxy resins find wide use industrially in many applications. Recent developments have provided the capability to UV cure epoxy resins via a photoinitiated cationic cure. Some typical cationic photoinitiators include aryldiazonium compounds, diaryliodonium compounds, triarylselenonium compounds, and triarylsulfonium compounds. The sulfonium compounds have found the most widespread use. Crivello in U.S. Pat. No. 4,058,401, issued Nov. 15, 1977; in U.S. Pat. No. 4,138,255, issued Feb. 6, 1979; and in U.S. Pat. No. 4,161,478, issued July 17, 1979, teaches the cationic polymerization of epoxy resin materials, such as epoxy monomers or prepolymers, by the use of certain radiation sensitive aromatic onium salts of Group VIa elements. Such onium salts of Group VIa elements have an $MF_6$ anion where M is P, As, or Sb. These onium salts are found to be photoactive under ultraviolet light. Crivello teaches that curable compositions can be used as sealants, coating compounds, and encapsulants.

Smith in U.S. Pat. No. 4,256,828, issued Mar. 17, 1981, teaches photocopolymerizable compositions containing epoxides, organic material with hydroxyl functionality, and a photosensitive aromatic sulfonium or iodonium salt of a halogen-containing complex ion. Smith uses these compositions to coat substrates.

Eckberg and LaRochelle in U.S. Pat. No. 4,421,904, issued Dec. 20, 1983, teach combining epoxy functional diorganosiloxane fluids with bis-aryl iodonium salts, particularly linear alkylate bis-dodecylphenyl iodonium salts to form silicone coating compositions to provide non-adherent surfaces. Eckberg et al teaches that the adhesion of the silicone coating to a substrate can be improved with the addition of beta-(3,4-epoxycyclohexyl)ethyltrimethoxysilane.

Pasternack et al in U.S. Pat. No. 4,585,534, issued Apr. 29, 1986, teach protecting a freshly drawn optical glass fiber with an ultraviolet-initiated, cationically curable liquid coating composition comprising a cationically curable polyepoxide, a polysiloxane carrying a plurality of hydroxyalkyl groups, and a photoinitiator and/or photosensitizer for an ultraviolet-activated cationic cure. Pasternack et al teach that the coatings have a low modulus and retain a low modulus at temperatures as low as −60° C.

The introduction of carbonol functional silicone surfactants into epoxy resin to improve the flexibility, especially at low temperatures is described in EP Appln. 124,057, filed Nov. 7, 1984, by Pasternack et al as glass coatings comprising a cationically curable polyepoxide, a polysiloxane carrying a plurality of hydroxyalkyl groups and a photoinitiator. Further improvement in the cured epoxy resin properties such as additional flexibility, solvent resistance, thermal resistance, and improved moisture resistance are still needed for many applications, such as in electronics. Improved cure rate is also desirable. The cure rate is too slow for many applications and epoxy resins exhibit too much shrinkage during curing for many applications. The flow characteristics are not adequate for some coating applications such as in circuit board coating and paper coatings without the use of modifiers, including solvents. The epoxy resins are often too brittle for many coating uses to provide the desired protective properties. Thermal cure of epoxy resins also limits the utility of these materials to uses where the substrates can withstand the required temperatures of curing. It is these problems to which this invention is directed.

SUMMARY OF THE INVENTION

The compositions of the invention are solvent-free and designed to give fast cure (such as from 1 to 20 seconds), and hard, yet flexible coatings which are thermally stable and exhibit good adhesion to a wide variety of substrates. Furthermore, the coatings have excellent solvent and steam resistance. The coatings exhibit excellent (unprimed) adhesion to glass and to the components used in electrical devices. Furthermore, thick films (e.g. ¼ inch) are fast curing and usable as encapsulants.

This invention relates to a composition curable upon irradiation with ultraviolet radiation comprising a cationically curable organic epoxy resin having at least two epoxy groups per molecule, a silanol functional component which contains aryl group bonded to silicon atom by a silicon-carbon bond, and a photoinitiator for an ultraviolet activated cationic cure.

This invention also relates to an ultraviolet curable composition useful for many coating compositions which have improved flexibility and do not require as stringent requirements for moisture pickup as some electronic device applications. These compositions comprise a cationically curable organic epoxy resin having at least two epoxy groups per molecule, a silanol functional compound which contains aryl group bonded to silicon atom by a silicon-carbon bond, a cationic ultraviolet photoinitiator, and a carbonol functional polysiloxane in addition.

DESCRIPTION OF THE PREFERRED EMBODIMENTS

The epoxy resins can be any of those which are well known in the art, preferably the epoxy resins are those epoxy resins which are liquid at room temperature to permit easy handling without the use of solvents. The epoxy resins are those which have at least two epoxy groups per molecule, preferably cycloaliphatic epoxy resins having two epoxy groups per molecule. Useful epoxy resins include those disclosed in European Patent Publication No. 124,057, for example, the polyepoxides based on hydrogenated bisphenol, such as Eponex DRH 1511 and DRH 1510; glycidyl ethers of a bisphenol, such as Shell products Epon 828 and Epon 1001, and the Ciba-Geigy product Araldite 6010; and polyepoxides based on phenolic novalac resins and epoxidized polybutadienes. Preferably, the epoxy resins are those epoxy resins which are liquid at room temperature to permit easy handling without the use of solvents. These preferred epoxy resins are commercially available and include those, for example, which are available from Union Carbide Chemicals and Plastics Division of Union Carbide Corporation and are known as ERL-4206 a low viscosity liquid cycloaliphatic epoxy resin having a viscosity of less than 13 centipoise at 25° C. and an epoxy equivalent, G./G. Mol oxirane oxygen of 70 to 74; ERL-4221 a low viscosity liquid cycloaliphatic epoxy resin having a viscosity of 350 to 450 centipoise at 25° C. and an epoxy equivalent of 131 to 143; ERL-4234 a high viscosity liquid cycloaliphatic epoxy resin having a viscosity of 10,000 to 18,000 centipoise at 100° F. and an epoxy equivalent of 143 to 157; and ERL-4299 a low viscosity liquid cycloaliphatic epoxy resin having a viscosity of 550 to 750 centipoise at 25° C. and an epoxy equivalent of 190 to 210. Araldite(R) CY-179 sold by Ciba-Geigy Corporation is also suitable and is a diepoxy carboxylate cycloaliphatic liquid epoxy resin which is equivalent to ERL-4221. Another cycloaliphatic epoxy resin which is commercially available is Eponex(R) 1510, also identified as DRH 151, sold by Shell Oil Company. Eponex 1510 is isopropylidene [4,4'-bis(2,3-epoxypropoxy)cyclohexane].

Some of the epoxy resins, which are included but not limited hereto, are those of the following formulae.

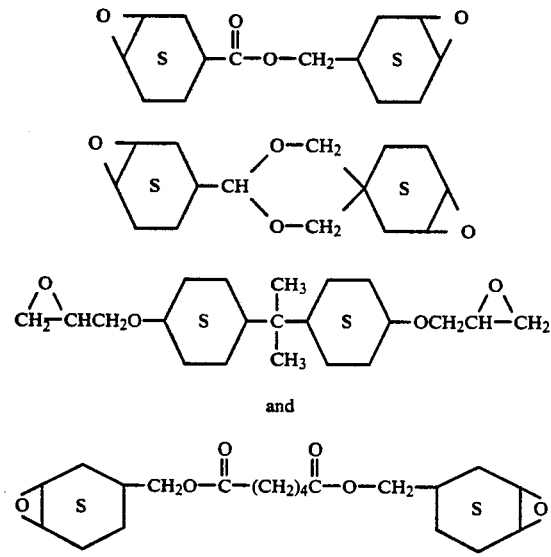

and

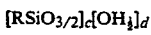

For the purposes of this invention, the term epoxy resin is intended to include not only those resins which are compounds with at least two epoxy groups per molecule, but also those which are polymeric such the reaction products of epichlorohydrin and phenol or a phenol-formaldehydide resin, diepoxy resins, epoxidized oils, and epoxidized polyolefins.

Silanol functional compounds for use in the invention can be monomers, linear polysiloxanes, or siloxane resins. The silanol functional compound contains at least one silicon atom with at least one aryl group bonded to it via a silicon-carbon bond. Preferably, at least 20 percent of the organic groups bonded to the silicon atoms of the silanol functional compound are aryl groups. Some typical examples of linear silanol functional siloxanes include silanol functional compounds as taught by Bowman et al in U.S. Pat. No. 4,486,567, issued Dec. 4, 1984, of the formula HO(R$_2$SiO)$_y$H wherein each R is a monovalent organic radical selected from the group consisting of methyl, ethyl, propyl, phenyl, vinyl, allyl and 3,3,3-trifluoropropyl radicals and y has an average value of at least 2 and preferably from 2 to 50. Bowman et al is hereby incorporated by reference to show linear silanol functional siloxanes. They are commercial materials and can be made by the addition of the appropriate diorganodichlorosilane to a water/solvent mixture. Silanol functional monomers include those which have the formula

in which each R is a monovalent hydrocarbon radical, preferably at least on R is an aryl radical such as phenyl, and x is 2 or 3. Example of monomers include diphenylsilanediol, methylphenylsilanediol, and diphenylmethylsilanol.

Silanol functional siloxane resins can be those which are polyorganosiloxanes having a ratio of organic groups to silicon atoms of less than 1.8:1 and having at least two silanol groups per molecule. Preferred siloxane resins includes those having at least 20 percent of the organic groups as aryl groups and at least one weight percent of the polyorganosiloxane is silicon-bonded hydroxyl groups. A preferred silanol functional siloxane resin for the invention compositions is a silanol functional aryl substituted polysiloxane of the formula:

[RSiO$_{3/2}$]$_c$[OH$_1$]$_d$ wherein each R is either a phenyl group or an alkyl group of 1 to 4 carbon atoms, and 60 to 80 percent of the R groups are phenyl, 20 to 40 percent of the R groups are alkyl, and c and d have values such that the hydroxyl content is from 15 to 25 weight percent.

The photoinitiators for this invention are those which are activated by ultraviolet radiation to provide a cationic cure. Such photoinitiators are the photosensitive aromatic onium salts which are known in the art and are described by Crivello ('401), ('255), and ('478) which are hereby incorporated by reference to show the onium salts. Preferably, the photosensitive aromatic onium salt is a catalyst which is activated by ultraviolet radiation which in turn initiates a cationic crosslinking process. Some of the commercially available photosensitizer aromatic onium salts include 3M Brand UV Activated Epoxy Curatives of FC-503, FC-504, FC-508, FX512, L-9204, and L-9260 which are manufactured by the Commercial Chemicals Division of the Minnesota Mining and Manufacturing Company; and RVE-1014 Epoxy Curing Agent which is manufactured by the General Electric Company. Some examples of the photosensitive aromatic onium salts include triphenylsulfonium tetrafluoroborate, triphenylselenonium hexafluoroborate, triphenylselenonium hexafluoroarsenate, triphenylselenonium hexafluoroantimonate, phenacyltetramethylene sulfonium hexafluoroarsenate, triphenylsulfonium fluoroborate, S-phenyldibenzothiophenium fluoroborate, triphenylsulfonium hexafluoroarsenate, S-phenylthioxanthene fluoroborate, phenacyltetramethylene sulfonium hexafluoroarsenate, triphenylsulfonium hexafluoroantimonate, tris(3,5-dimethyl-4-hydroxy)phenylsulfonium hexafluoroarsenate, and triphenacyl hexafluoroarsenate. The use of photosensitive aromatic onium salts to promote the cure of epoxy resins when exposed to ultraviolet radiation is described by the Crivello patents discussed herein. Only a minor but effective amount of catalyst is required. Generally from about 0.1% to about 10% and preferably from 2% to 5% by weight of the composition is employed.

An optional ingredient can be a carbonol functional polyether containing polysiloxane. These polysiloxanes can be used when the applications are not highly sensitive to moisture uptake because the presence of the polyether groups is more likely to absorb moisture than when it is absent from the composition. The presence of these carbonol functional polyether polysiloxanes are useful for improving the flexibility of the coatings, the adhesion, solvent resistance, and the thermal resistance. For example, polysiloxanes with hydroxy alkyl groups such as taught by Pasternack et al in the European patent publication cited above can be used.

These polyether polysiloxanes are siloxane polymers which contain at least two hydroxyl-functional polyether groups bonded to silicon atoms of the siloxane polymer through a silicon-carbon bond. These polyorganosiloxanes are preferably liquid. For making clear coatings, the polyorganosiloxanes are preferably compatible with the epoxy resin and the silanol functional compound or at least become compatible through reaction during the curing process for the composition. The hydroxyl-functional polyether groups bonded to the silicon atoms through a silicon-carbon bond can have the following formula

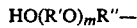

HO(R'O)$_m$R''— in which each R' is an alkylene radical having 2 to 10 carbon atoms, each R'' is an alkylene radical having from 1 to 12 carbon atoms, and m is at least one, preferably 2 to 20. Preferred polyorganosiloxanes have at least two units of the general unit formula.

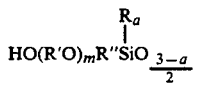

$$HO(R'O)_m R'' \underset{\displaystyle 2}{\overset{\displaystyle R_a}{\mathop{SiO_{3-a}}}}$$

wherein each R is a monovalent hydrocarbon radical containing from 1 to 12 carbon atoms, R' is an alkylene radical containing from 2 to 10 carbon atoms, R'' is an alkylene radical containing from 1 to 12 carbon atoms, m is an integer having a value of from 1 to 30, and a has a value of from 0 to 2. The remaining units of the carbonol functional polysiloxane can be those of the general unit formula

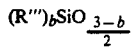

$$(R''')_b SiO_{\frac{3-b}{2}}$$

in which each R''' is a monovalent hydrocarbon radical containing from 1 to 12 carbon atoms and b has an average value of from 1 to 3. The most preferred polyorganosiloxanes are those in which R''' is a methyl radical, R'' is a propylene radical, and R' is either an ethylene radical, a propylene radical, or a mixture of ethylene and propylene radicals. R can be illustrated by alkyl radicals, such as methyl, ethyl, propyl, butyl, and decyl radicals; cycloalkyl radicals, such as cyclohexyl and cyclopentyl radicals; aryl radicals, such as phenyl, tolyl, xylyl, and naphthyl radicals; aralkyl radicals, such as benzyl and beta-phenylethyl radicals; alkenyl radicals, such as vinyl, allyl, and hexenyl radicals; and cycloalkenyl, such as cyclohexenyl radicals. R' can be illustrated by the alkylene radicals such as ethylene, 1,2-propylene, 1,3-propylene, 1,6-hexylene, 2-ethylhexylene-1,6 and 1,12-dodecylene radicals. R'' can be illustrated by methylene, ethylene, 1,2-propylene, 1,3-propylene, 1,4-butylene, and 1,12-dodecylene, preferably R' has at least 3 carbon atoms. R''' can be the same as R as illustrated above. A preferred class of carbonolfunctional polyether polysiloxanes are those having a molecular weight of from 400 to 40,000 and having from 2 to 15 hydroxyl-functional polyether groups per molecule.

The carbonol functional polyether polyorganosiloxanes are available commercially and are well-known in the art. The following patents are hereby incorporated by reference to show the polyorganosiloxanes which have hydroxyl functional groups and methods of preparing them: U.S. Pat. No. 3,280,160, issued Oct. 18, 1966, to Bailey; U.S. Pat. No. 3,629,308, issued Dec. 21, 1971 to Bailey et al; and U.S. Pat. No. 4,122,029, issued Oct. 24, 1978 to Gee et al.

The proportions will vary depending upon the use, but generally, the coating composition can comprise 40-94.9% by weight of the epoxy resin and 5-59.9% by weight of the silanol functional compound, and 0.1-10% by weight photoinitiator, based on the total weight of the composition. In those compositions which additionally contain carbonol-functional polyether polysiloxane, it can be present in amounts up to about 65% by weight based on the total weight of the composition, preferably from 1-35% by weight. The ingredients can be easily mixed at room temperature and subjected to UV radiation when curing is desired. Sometimes the mixture of ingredients is warmed to speed up the blending process.

The composition of this invention includes blends of the ingredients wherein more than one kind of epoxy resin is present, more than one kind of silanol functional compound is present and more than one kind of photoinitiator is present. In those compositions containing the carbonol-functional polyether polysiloxane, more than one kind of these can be additionally blended with the epoxy resin, silanol functional compound, and photoinitiator. Such blends permit the properties of the end products to be modified and achieve different characteristics. The compositions of this invention cure faster than epoxy resins per se when exposed to ultraviolet radiation. The flow out properties of the compositions is improved and can be used to coat many kinds of electronic devices. These compositions can also be used to protect surfaces, and can be used as paper coatings, glass coatings and other substrates which might be sensitive to heat curing but can withstand the ultraviolet radiation, such as plastics. Some of these coating applications can use the compositions which contain the carbonol-functional polyether polysiloxane because they are less sensitive to moisture pickup than some of the electronic device coatings.

The compositions of the present invention can be cured to provide films which show enhanced flexibility compared to epoxy resins, exhibit adhesion properties which makes them useful for adhering many substrates together, have increased cure rates, and have improved thermal stability compared to epoxy resins. The compositions can be used without the use of solvents which adds to their usefulness because many solvents make the processes expensive in view of governmental regulations imposed on the user. The compositions which are essentially composed of epoxy resin, silanol functional compound and photoinitiator are especially attractive for use as coatings for printed circuit boards and as blob coatings.

The following examples are for illustrative purposes and should not be construed as limiting the present invention which is properly delineated in the claims. Parts in the following examples are parts by weight unless otherwise stated. In the following examples pH=phenyl radical, Me=methyl radical, and Pr=propyl radical.

EXAMPLE 1

Compositions were prepared by blending 100 parts of 3,4-epoxycyclohexylmethyl-3,4-epoxycyclohexane carboxylate, the parts described in Table I of the identified silanol functional compound (identified as Silanol), and an amount of UVE-1014 (a photosensitive aromatic onium salt which is a 50 percent solution of a triarylsulfonium antimony hexafluoride dissolved in propylene carbonate). Each of the compositions were exposed to ultraviolet radiation as defined and the cured properties were observed and were as reported in the Table I.

The diphenylsilanediol exhibits exception depth cure compared to some of the other silanol monomers.

EXAMPLE 2

An ultraviolet curable composition was prepared by blending ERL-4221 (3,4-epoxycyclohexylmethyl-3,4-epoxycyclohexane carboxylate) as the epoxy resin, a carbonol-functional polyether polydimethylsiloxane of the following average formula

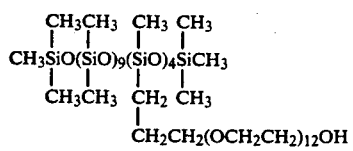

and a silanol functional compound having the following average general formula

TABLE I

| SILANOL | PARTS SILANOL | PARTS UVE 1014 | CURE CONDITIONS | FILM**** THICKNESS, MILS | COMMENTS |
| --- | --- | --- | --- | --- | --- |
| NONE | NONE | 4 | 1* | 14 | BRITTLE HARD |
| HO(PhMeSiO)~6OH | 15 | 4 | 1* | 18 | MORE FLEXIBLE THAN NONE |
| HO(PhMeSiO)~6OH | 30 | 4 | 1* | 17 | MORE FLEXIBLE THAN NONE |
| Ph2MeSiOH | 15 | 4 | 1* | 23 | MORE FLEXIBLE THAN NONE |
| Ph2MeSiOH | 30 | 4 | 1* | 22 | MORE FLEXIBLE THAN NONE AND WEAK |
| HO(Me2SiO)~10OH*** | — | | | | |
| Ph2Si(OH)2 | 15 | 4 | 1* | >60 | BRITTLE |
| Ph2Si(OH)2 | 30 | 4 | 1* | >60 | BRITTLE OPAQUE |
| HO(PhMeSiO)50OH | 15 | 4 | 1* | 19 | MORE FLEXIBLE THAN NONE AND HAZY |
| HO(PhMeSiO)50OH | 30 | 4 | 1* | 18 | MORE FLEXIBLE THAN NONE AND WEAK |
| NONE** | NONE | 1 | 2* | ca 70 | DRY SURFACE HARD AND CRUMBLY |
| HO(PhMeSiO)~6OH | 15 | 1 | 2* | — | TOUGHER MORE FLEXIBLE THAN NONE |
| HO(PhMeSiO)~6OH | 30 | 4 | 2* | ca 40 | MUCH MORE FLEXIBLE THAN NONE |
| Ph2MeSiOH | 15 | 4 | 2* | 40 | MORE FLEXIBLE THAN NONE |
| Ph2MeSiOH | 30 | 4 | 2* | 40 | FLEXIBILITY MARKEDLY IMPROVED OVER NO SILANOL |

*1 = Composition coated on aluminum Q-panels and cured at 50 feet per minute being irradiated with ultraviolet light (75 mJ/cm$^2$ at 365 nm) in 2.4 seconds using a pair of Ashdee Model UV-12H/2 lamps at 200 watts in median pressure mercury vapor arc lamps. The light intensity was measured with a Model 205 UV Powermeter equipped with a 365 nm filter manufactured by Optical Associates, Inc of Milpitas, Ca.
*2 = Composition coated on aluminum Q-panels and cured at 5 feet per minute being irradiated with ultraviolet light (746 mJ/cm$^2$ at 365 nm) in 24 seconds.
**Comparative Example
***Comparative Example, silanol functional compound was incompatible and two phases formed.
****Film thickness of cured material after 5 passes or about 12 sec.

wherein the values of f, g, and h were such that the phenyl group constituted about 67 percent of the organic groups bonded to silicon atoms and propyl groups constituted about 33 percent of the organic groups bonded to silicon atoms with there being about 21 weight percent silicon bonded hydroxyl groups. The composition was prepared by blending 40 parts of the silanol functional compound and 40 parts of the carbonol-functional polyether polydimethylsiloxane obtaining a single phase mixture. To the resulting mixture, 44 parts of the epoxy resin was added, followed by 4 parts of UVE-1014 (the photoinitiator). The resulting mixture was clear and colorless at room temperature with a viscosity of about 1360 centipoise. A thin film of the mixture was coated on a substrate which cured in less than one second upon exposure to ultraviolet radiation. The cured coating was flexible and exhibited excellent adhesion to substrates such as glass, showed solvent resistance to xylene and acetone, and exhibited thermal resistance by withstanding 320° F. for several hours.

A sample of the cured coating was exposed to post-treatment of steam for five minutes resulting in a substantial increase in electrical resistivity. In some of the coatings, an increase in electrical resistivity of such compositions was as much as $10^6$ higher after exposure to post-treatment with steam than before such post-treatment.

EXAMPLE 3

A composition prepared and tested in the same manner as described in Example 2, except the silanol functional compound of Example 2 was replaced with a silanol functional poly(phenylsilsequioxane), PR6163 from Petrarch Corporation. The amount of UVE-1014 was 3-4 weight percent based on the weight of the composition. The resulting mixture had a viscosity at 25° C. of 1320 centipoise. The cured film had similar properties to those of Example 2.

EXAMPLE 4

A composition was prepared and tested in the same manner as described in Example 2, except the epoxy resin was ERL-4234 from Union Carbide Corporation and had the formula

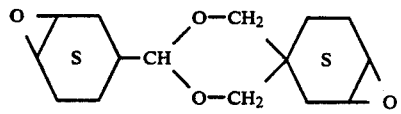

The mixture had a viscosity at 25° C. of 3400 centipoise and cured to films with properties similar to those of Example 2.

EXAMPLE 5

A composition was prepared and tested in the same manner as described in Example 4, except the silanol functional compound was replaced with the silanol functional poly(phenylsilsesquioxane) of Example 3. The resulting mixture had a viscosity at 25° C. of 3720 centipoise and cured to a film similar in properties to those of Example 2.

That which is claimed:

1. A process of increasing the electrical resistivity of an ultraviolet radiation cured coating comprising exposing a composition comprising a cationically curable organic epoxy resin having at least two epoxy groups per molecule, a silanol functional component which contains aryl groups bonded to silicon atom by a silicon-carbon bond, and a photoinitiator for an ultraviolet activated cationic cure, to a curing amount of ultraviolet radiation to obtain a cured product and then subjecting the product to steam for a time sufficient to increase the electrical resisitivity.

2. A process of increasing the electrical resistivity of an ultraviolet radiation cured coating comprising exposing a composition comprising a cationically curable organic epoxy resin having at least two epoxy groups per molecule, a silanol functional component which contains aryl groups bonded to silicon atom by a silicon-carbon bond, a carbonol functional polyether containing polysiloxane in which there is at least one siloxane unit of the formula

wherein each R is a monovalent hydrocarbon radical containing from 1 to 12 carbon atoms, R' is an alkylene radical containing from 2 to 10 carbon atoms, R" is an alkylene radical containing from 1 to 12 carbon atoms, m is an integer having a value of from 1 to 30, and a has a value of from 0 to 2 and any remaining units of the carbonol functional polysiloxane can be those of the general unit formula

in which each R''' is a monovalent hydrocarbon radical containing from 1 to 12 carbon atoms and b has an average value of from 1 to 3, and a photoinitiator for an ultraviolet activated cationic cure, to a curing amount of ultraviolet radiation to obtain a cured product, and then subjecting the product to steam for a time sufficient to increase the electrical resistivity.

* * * * *